United States Patent
Hirabayashi et al.

(10) Patent No.: US 10,840,384 B2
(45) Date of Patent: Nov. 17, 2020

(54) SCHOTTKY BARRIER DIODE AND ELECTRONIC CIRCUIT PROVIDED WITH SAME

(71) Applicant: TDK CORPORATION, Tokyo (JP)

(72) Inventors: Jun Hirabayashi, Tokyo (JP); Yutaka Matsuo, Tokyo (JP); Minoru Fujita, Tokyo (JP); Jun Arima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/348,592

(22) PCT Filed: Sep. 11, 2017

(86) PCT No.: PCT/JP2017/032612
§ 371 (c)(1),
(2) Date: May 9, 2019

(87) PCT Pub. No.: WO2018/088018
PCT Pub. Date: May 17, 2018

(65) Prior Publication Data
US 2020/0058804 A1    Feb. 20, 2020

(30) Foreign Application Priority Data

Nov. 9, 2016   (JP) .................................. 2016-218652

(51) Int. Cl.
*H01L 29/872*   (2006.01)
*H01L 29/41*   (2006.01)
(Continued)

(52) U.S. Cl.
CPC ...... *H01L 29/872* (2013.01); *H01L 21/02414* (2013.01); *H01L 21/02565* (2013.01);
(Continued)

(58) Field of Classification Search
None
See application file for complete search history.

(56) References Cited

U.S. PATENT DOCUMENTS

| | | | |
|---|---|---|---|
| 2009/0189276 A1 | 7/2009 | Sano et al. | |
| 2014/0239452 A1* | 8/2014 | Sasaki | H01L 29/045 257/613 |

(Continued)

FOREIGN PATENT DOCUMENTS

| | | |
|---|---|---|
| JP | 05275579 H | 10/1993 |
| JP | 07336009 H | 12/1995 |

(Continued)

*Primary Examiner* — Robert K Carpenter
(74) *Attorney, Agent, or Firm* — Young Law Firm, P.C.

(57) ABSTRACT

An object of the present invention is to provide a Schottky barrier diode using gallium oxide capable of suppressing heat generation and enhancing heat radiation performance while ensuring mechanical strength and handling performance. A Schottky barrier diode includes a semiconductor substrate 20 made of gallium oxide having a recessed part 23 on the second surface 22, an epitaxial layer 30 made of gallium oxide and provided on a first surface 21 of the semiconductor substrate 20; an anode electrode 40 provided at a position overlapping the recessed part 23 as viewed in the lamination direction and brought into Schottky contact with the epitaxial layer 30, and a cathode electrode 50 provided in the recessed part 23 of the semiconductor substrate 20 and brought into ohmic contact with the semiconductor substrate 20. According to the present invention, since the thickness of the semiconductor substrate at a part thereof where forward current flows is selectively reduced, this makes it possible to suppress heat generation and to enhance heat radiation performance while ensuring mechanical strength and handling performance. Thus, even though gallium oxide having a low heat conductivity is used (Continued)

as the material of the semiconductor substrate, a temperature rise of the element can be suppressed.

13 Claims, 5 Drawing Sheets

(51) Int. Cl.
   *H01L 29/47* (2006.01)
   *H01L 21/28* (2006.01)
   *H01L 21/02* (2006.01)

(52) U.S. Cl.
   CPC .. *H01L 21/02576* (2013.01); *H01L 21/02631* (2013.01); *H01L 21/28* (2013.01); *H01L 29/41* (2013.01); *H01L 29/47* (2013.01)

(56) References Cited

U.S. PATENT DOCUMENTS

| | | | |
|---|---|---|---|
| 2014/0332823 A1 | 11/2014 | Takizawa et al. | |
| 2017/0213918 A1 | 7/2017 | Sasaki et al. | |

FOREIGN PATENT DOCUMENTS

| | | | | |
|---|---|---|---|---|
| JP | 2002170963 A | | 6/2002 | |
| JP | 2007134521 A | * | 5/2007 | |
| JP | 2009206496 A | | 9/2009 | |
| JP | 2013102081 A | | 5/2013 | |
| JP | 2016031953 A | | 3/2016 | |

* cited by examiner

SCHOTTKY BARRIER DIODE AND ELECTRONIC CIRCUIT PROVIDED WITH SAME

TECHNICAL FIELD

The present invention relates to a Schottky barrier diode and an electronic circuit provided with the same and, more particularly, to a Schottky barrier diode using gallium oxide and an electronic circuit provided with the same.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode may be utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap may be used in place of silicon (Si). Among them, gallium oxide has a very large band gap (4.8 eV to 4.9 eV) and a large breakdown field (7 MV/cm to 8 MV/cm), so that a Schottky barrier diode using gallium oxide is very promising as the switching element for a power device. Patent Document 1 describes an example of the Schottky barrier diode using gallium oxide.

However, gallium oxide has a significantly lower heat conductivity than silicon (Si), silicon carbide (SiC), and gallium nitride (GaN). Thus, when a Schottky barrier diode using gallium oxide is used as the switching element for a power device, heat generated by forward current is not efficiently radiated outside to easily deteriorate the element. To cope with this problem, in the Schottky barrier diode described in Patent Document 1, the thickness of a gallium oxide substrate is reduced to 50 μm or less to thereby enhance heat radiation performance while suppressing heat generation due to forward current.

CITATION LIST

Patent Document

[Patent Document 1] JP 2016-031953 A

SUMMARY OF INVENTION

Technical Problem to be Solved by Invention

However, simple reduction in the thickness of the gallium oxide substrate may not only cause shortage of mechanical strength of the element but also make the element difficult to handle at manufacturing or mounting.

It is therefore an object of the present invention to provide a Schottky barrier diode using gallium oxide capable of suppressing heat generation and enhancing heat radiation performance while ensuring mechanical strength and handling performance.

Means for Solving the Problem

A Schottky barrier diode according to the present invention includes: a semiconductor substrate made of gallium oxide, having a first surface and a second surface positioned on the side opposite to the first surface, and having a recessed part on the second surface side; an epitaxial layer made of gallium oxide and provided on the first surface of the semiconductor substrate; an anode electrode provided at a position overlapping the recessed part as viewed in the lamination direction and brought into Schottky contact with the epitaxial layer; and a cathode electrode provided in the recessed part of the semiconductor substrate and brought into ohmic contact with the semiconductor substrate.

Further, an electronic circuit according to the present invention includes: a circuit board having an electrode pattern; the Schottky barrier diode mounted on the circuit board; and a conductive member at least partially embedded in the recessed part of the semiconductor substrate and connecting the electrode pattern and the cathode electrode.

According to the present invention, since the recessed part is provided in the semiconductor substrate made of gallium oxide, the thickness of the semiconductor substrate at a part thereof where forward current flows can be selectively reduced. This makes it possible to suppress heat generation and to enhance heat radiation performance while ensuring mechanical strength and handling performance. Thus, even though gallium oxide having a low heat conductivity is used as the material of the semiconductor substrate, a temperature rise of the element can be suppressed.

In the present invention, the recessed part of the semiconductor substrate preferably includes a bottom surface overlapping the first surface in a plan view and an inner wall surface connecting the bottom surface and the second surface, and the cathode electrode is preferably formed at least on the bottom surface of the recessed part. This can minimize the length of a current path for the forward current, making it possible to further reduce heat generation.

In this case, the cathode electrode may be formed further on the inner wall surface of the recessed part and further on the second surface positioned outside the recessed part. This improves solder wettability at mounting, enhancing mounting reliability.

In the present invention, the area of recessed part as viewed in the lamination direction is preferably smaller than the area of the anode electrode. This makes it possible to minimize reduction in mechanical strength due to existence of the recessed part while suppressing heat generation due to forward current. Even in this case, the area of the recessed part as viewed in the lamination direction is preferably 50% or more of the area of the anode electrode. This can enhance heat radiation performance sufficiently.

In the present invention, the thickness of the semiconductor substrate at the position where the recessed part is formed is preferably 50 μm or larger. Thus, a certain degree of mechanical strength can be ensured even at the formation position of the recessed part, making it difficult to cause breakage of the semiconductor substrate even when wire bonding is applied to the anode electrode.

In the present invention, the recessed part preferably communicates with the side surface of the semiconductor substrate. With this configuration, air residing in the recessed part is discharged outside when a solder is embedded in the recessed part at mounting, thereby preventing an air layer from being formed in the recessed part. This prevents heat radiation performance from being impaired by the air layer. In this case, the recessed part may be constituted of a plurality of slits or formed in a mesh.

Advantageous Effects of the Invention

As described above, according to the present invention, it is possible to suppress heat generation and to enhance heat radiation performance while ensuring mechanical strength and handling performance of the Schottky barrier diode using gallium oxide. Thus, even though gallium oxide having a low heat conductivity is used, a temperature rise of the element can be suppressed.

MODE FOR CARRYING OUT THE INVENTION

Preferred embodiments of the present invention will now be explained in detail with reference to the drawings.

First Embodiment

Figure 1:
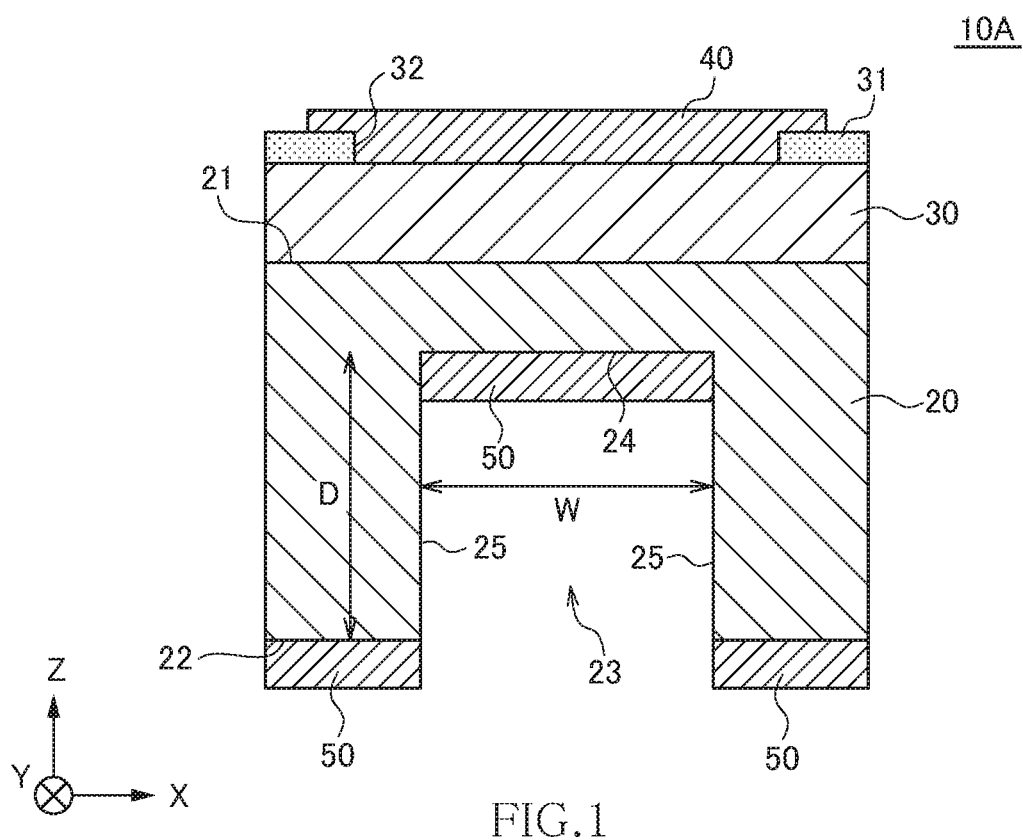
FIG. 1 is a cross-sectional view illustrating the configuration of a Schottky barrier diode 10A according to a first embodiment of the present invention.
Figure 2:
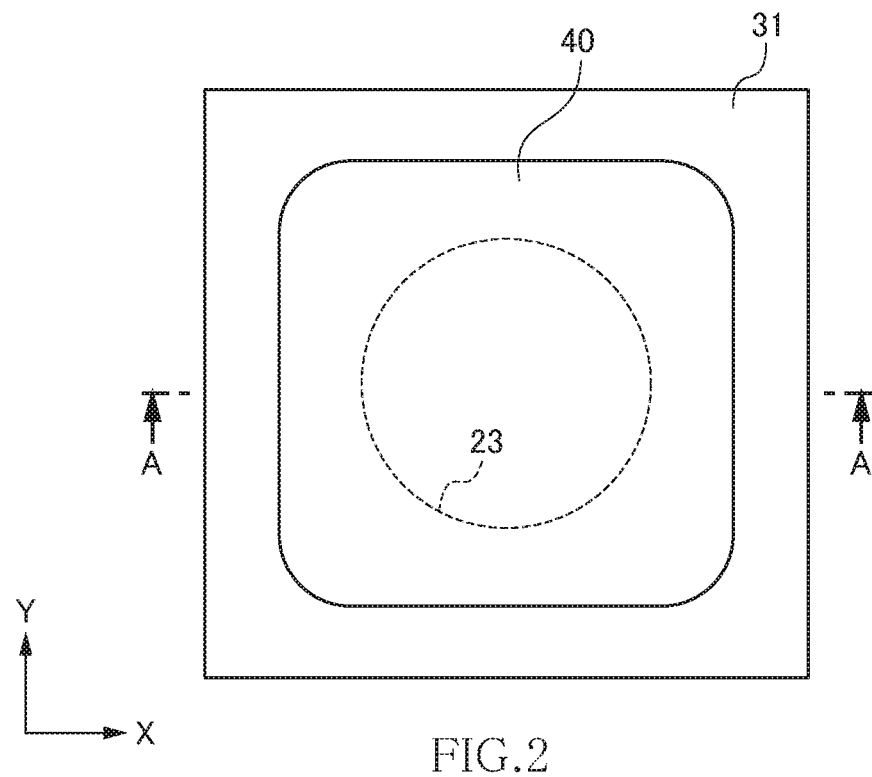
FIG. 2 is a top view of the Schottky barrier diode 10A.

FIG. 1 is a cross-sectional view illustrating the configuration of a Schottky barrier diode 10A according to the first embodiment of the present invention. FIG. 2 is a top view of the Schottky barrier diode 10A. The cross section illustrated in FIG. 1 corresponds to the cross section taken along line A-A in FIG. 2.

As illustrated in FIG. 1, the Schottky barrier diode 10A according to the first embodiment includes a semiconductor substrate 20 and an epitaxial layer 30, both of which are made of gallium oxide ($\beta$-$Ga_2O_3$). The semiconductor substrate 20 and epitaxial layer 30 each contain, as an n-type dopant, silicon (Si) or tin (Sn). The concentration of the dopant is higher in the semiconductor substrate 20 than in the epitaxial layer 30 and, as a result, the semiconductor substrate 20 and the epitaxial layer 30 function as an $n^+$ layer and an $n^-$ layer, respectively.

The semiconductor substrate 20 is obtained by cutting a bulk crystal formed using a melt-growing method, and the thickness (height in the Z-direction) thereof is preferably at least equal to or larger than 50 μm and more preferably about 250 μm. This is because when the thickness of the semiconductor substrate 20 is smaller than 50 μm, the mechanical strength becomes insufficient, and the element becomes difficult to handle at manufacturing or mounting. On the other hand, when the thickness of the semiconductor substrate 20 is about 250 μm, it is possible to ensure sufficient mechanical strength and handling performance. While there is no particular restriction on the planar size of the semiconductor substrate 20, the planar size is generally selected in accordance with the amount of current flowing in the element and, when the maximum amount of forward current is about 20A, the widths in the X- and Y-directions may be set to about 2.4 mm.

The semiconductor substrate 20 has a first surface 21 positioned on the upper surface side in a mounted state and a second surface 22 opposite to the first surface 21, positioned on the lower surface side in a mounted state. The epitaxial layer 30 is formed on the entire first surface 21. The epitaxial layer 30 is a thin film obtained by epitaxially growing gallium oxide on the first surface of the semiconductor substrate 20 using a reactive sputtering method, a PLD method, an MBE method, an MOCVD method, or an HVPE method and functions as a drift layer. While there is no particular restriction on the film thickness of the epitaxial layer 30, the film thickness is generally selected in accordance with the backward withstand voltage of the element and, in order to ensure a withstand voltage of about 600 V, the film thickness may be set to, e.g., about 7 μm.

As illustrated in FIGS. 1 and 2, a recessed part 23 is formed in the second surface 22 of the semiconductor substrate 20 to selectively reduce the thickness of the semiconductor substrate 20 at this portion. In the present embodiment, the shape of the recessed part 23 as viewed in the Z-direction is a circular shape, but not limited thereto. The recessed part 23 can be formed by anisotropically etching the semiconductor substrate 20 from the second surface 22 side using, e.g., chlorine-based gas such as $BCl_3$. In the example of FIG. 1, a bottom surface 24 of the recessed part 23 constitutes the XY plane parallel to the first surface 21, and an inner wall surface 25 of the recessed part 23 constitutes a curved surface parallel to the Z-direction. However, the bottom surface 24 need not be completely parallel to the first surface 21 as long as it overlaps the first surface 21 in a plan view. Accordingly, the bottom surface 24 may be inclined or bent relative to the XY plane. Further, the inner wall surface 25 also need not be a vertical surface completely parallel to the Z-direction as long as it connects the bottom surface 24 and the second surface 22. Accordingly, the inner wall surface 25 may be inclined relative to the Z-direction.

While there is no particular restriction on a depth D and a diameter W of the recessed part 23, when the thickness of the semiconductor substrate 20 is 250 μm, the depth D may be set to about 50 μm to about 225 μm, and the diameter W may be set to about 100 μm to about 200 μm. Further, the depth D is preferably set such that the thickness of the semiconductor substrate 20 at the portion where the recessed part 23 is formed, i.e., the distance between the first surface 21 and the bottom surface 24 in the Z-direction is 50 μm or larger. This is because when the thickness of the semiconductor substrate 20 at this position is smaller than 50 μm, mechanical strength at this portion becomes insufficient, which may cause breakage of the semiconductor substrate 20 at wire bonding. On the other hand, when the depth D of the recessed part 23 is excessively small, a sufficient heat generation suppressing effect or heat radiating effect cannot be obtained. Thus, the thickness of the semiconductor substrate 20 at the position where the recessed part 23 is formed is preferably set to 100 μm or smaller.

As illustrated in FIG. 1, an insulating film 31 having an opening 32 is formed on the upper surface of the epitaxial layer 30, and an anode electrode 40 is formed on the insulating film 31. As a result, the anode electrode 40 is brought into Schottky contact with the epitaxial layer 30 through the opening 32 of the insulating film 31. The insulating film 31 is made of, e.g., silicon oxide ($SiO_2$), and the film thickness thereof is about 300 nm. The anode electrode 40 is formed of a laminated film of, e.g., platinum (Pt), titanium (Ti), and gold (Au), and the film thickness thereof is about 150 nm (Pt layer), about 5 nm (Ti layer), and about 230 nm (Au layer).

As illustrated in FIGS. 1 and 2, the anode electrode 40 is provided at a position that overlaps the recessed part 23 in a plan view (as viewed in the Z-direction which is the lamination direction). Particularly, the XY area of the recessed part 23 is preferably smaller than the XY area of the anode electrode 40 so that the recessed part 23 completely overlaps the anode electrode 40 in a plan view. However, when the XY area of the recessed part 23 is excessively small, a heat radiating effect to be described later becomes insufficient, so that the XY area of the recessed part 23 is preferably 50% or more of the XY area of the anode electrode 40.

A cathode electrode 50 is provided on the second surface 22 of the semiconductor substrate 20. In the present embodiment, the cathode electrode 50 is formed on the bottom surface 24 of the recessed part 23 and on the second surface 22 positioned outside the recessed part 23 and is brought into ohmic contact with the semiconductor substrate 20. In the present invention, the cathode electrode 50 need not necessarily be formed outside the recessed part 23; however, it is preferable to form the cathode electrode 50 also outside the recessed part 23 as illustrated in FIG. 1 in terms of connection reliability to a circuit substrate at mounting and solder wettability.

With the above configuration, the anode electrode 40 and the cathode electrode 50 face each other in the Z-direction through the epitaxial layer 30 and the semiconductor substrate 20 having the recessed part 23. Thus, when forward voltage is applied between the anode electrode 40 and the cathode electrode 50, forward current flows in a portion thinned by the recessed part 23. That is, the length of a current path between the anode electrode 40 and the cathode electrode 50 is reduced as compared to a case where the recessed part 23 is not formed, allowing reduction in heat generation due to the resistance component of gallium oxide. In addition, the thickness of the semiconductor substrate 20 is reduced at only the recessed part 23, and a sufficient thickness is ensured outside the recessed part 23, making it possible to endure the mechanical strength of the semiconductor substrate 20 and the handling performance thereof.

Figure 3:
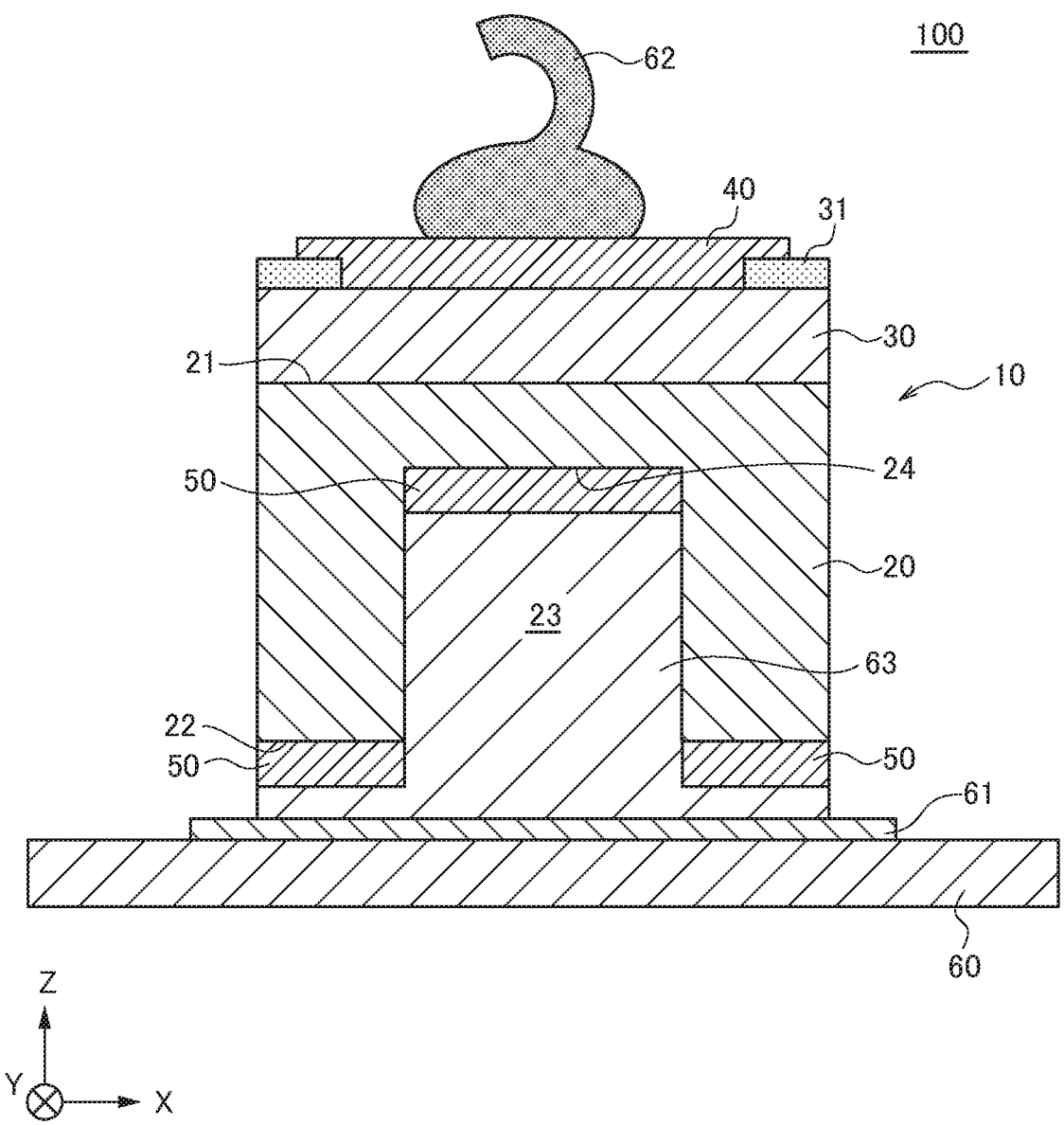
FIG. 3 is a cross-sectional view illustrating a part of an electronic circuit 100 provided with the Schottky barrier diode 10A.

FIG. 3 is a cross-sectional view illustrating a part of an electronic circuit 100 provided with the Schottky barrier diode 10A according to the present embodiment.

The electronic circuit 100 illustrated in FIG. 3 includes a circuit board 60 having an electrode pattern 61 and the Schottky barrier diode 10A mounted on the circuit board 60. The anode electrode 40 of the Schottky barrier diode 10A is connected to another electrode pattern (not shown) through a bonding wire 62, and the cathode electrode 50 of the Schottky barrier diode 10A is connected to the electrode pattern 61 through a solder 63.

As illustrated in FIG. 3, a part of the solder 63 is embedded in the recessed part 23 formed in the semiconductor substrate 20. As a result, the cathode electrode 50 formed on the bottom surface 24 of the recessed part 23 and the electrode pattern 61 are electrically connected to each other through the solder 63. The solder 63 has a significantly higher heat conductivity than the semiconductor substrate 20 made of gallium oxide, so that heat generated when forward current is made to flow in the Schottky barrier diode 10A is efficiently radiated to the circuit board 60 side through the solder 63 embedded in the recessed part 23. Thus, even though gallium oxide having a low heat conductivity is used as the material of the semiconductor substrate 20, a high heat radiation performance can be ensured. The conductive member connecting the cathode electrode 50 and the electrode pattern 61 is not limited to the solder 63, and other conductive members may be used.

As described above, in the Schottky barrier diode 10A according to the present embodiment, the thickness of the semiconductor substrate 20 is selectively reduced at the portion where the recessed part 23 is formed, so that it is possible to suppress heat generation and achieve a satisfactory heat radiation performance while ensuring mechanical strength and handling performance. Thus, the Schottky barrier diode 10A can be suitably used as a switching device for a power device.

Hereinafter, other embodiments of the present invention will be described.

Second Embodiment

Figure 4:
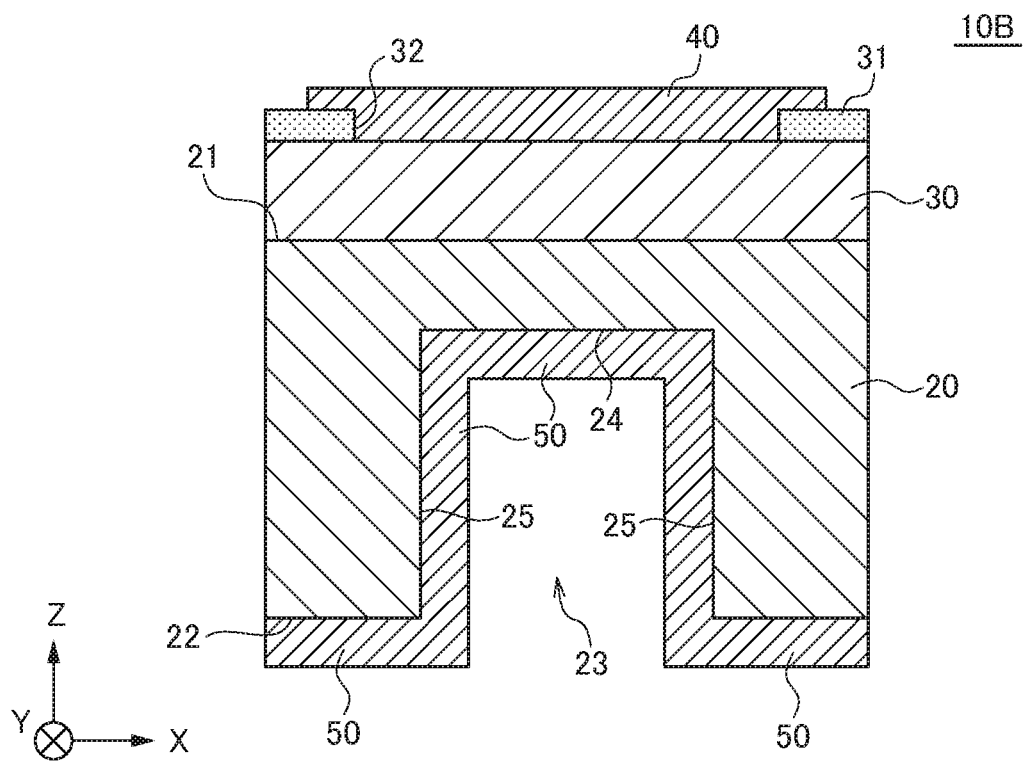
FIG. 4 is a cross-sectional view illustrating the configuration of a Schottky barrier diode 10B according to a second embodiment of the present invention.

FIG. 4 is a cross-sectional view illustrating the configuration of a Schottky barrier diode 10B according to the second embodiment of the present invention.

As illustrated in FIG. 4, the Schottky barrier diode 10B according to the second embodiment of the present invention differs from the Schottky barrier diode 10A according to the first embodiment in that the cathode electrode 50 is formed also on the inner wall surface 25 of the recessed part 23. Other configurations are the same as those of the Schottky barrier diode 10A according to the first embodiment, so the same reference numerals are given to the same elements, and overlapping description will be omitted.

In the present embodiment, the cathode electrode 50 is formed also on the inner wall surface 25 of the recessed part 23, so that the area of ohmic contact between the semiconductor substrate 20 and the cathode electrode 50 can be increased. In addition, the wettability of the solder 63 embedded in the recessed part 23 is improved by the cathode electrode 50 formed on the inner wall surface 25 of the recessed part 23, thereby enhancing connection reliability.

Third Embodiment

Figure 5:
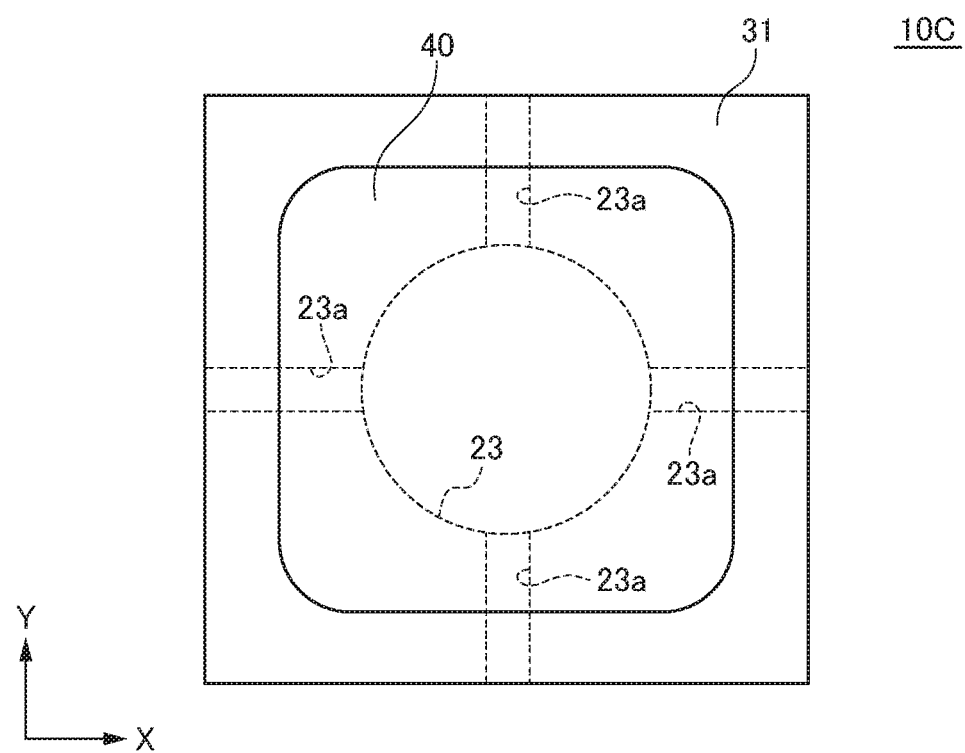
FIG. 5 is a top view illustrating the configuration of a Schottky barrier diode 10C according to a third embodiment of the present invention.

FIG. 5 is a top view illustrating the configuration of a Schottky barrier diode 10C according to the third embodiment of the present invention.

As illustrated in FIG. 5, the Schottky barrier diode 10C according to the third embodiment of the present invention differs from the Schottky barrier diode 10A according to the first embodiment in that communication holes 23a connecting the recessed part 23 and the side surface of the semiconductor substrate 20 are formed in the semiconductor substrate 20. Other configurations are the same as those of the Schottky barrier diode 10A according to the first embodiment, so the same reference numerals are given to the same elements, and overlapping description will be omitted.

In the example of FIG. 5, four communication holes 23a are formed, making the recessed part 23 communicate with the XZ and YZ side surfaces. Thus, when the solder 63 is embedded in the recessed part 23 at mounting on the circuit board 60, air residing in the recessed part 23 is discharged outside through the communication holes 23a. This prevents an air layer from being formed in the recessed part 23, thereby preventing heat radiation performance from being impaired by the air layer.

Fourth Embodiment

Figure 6:
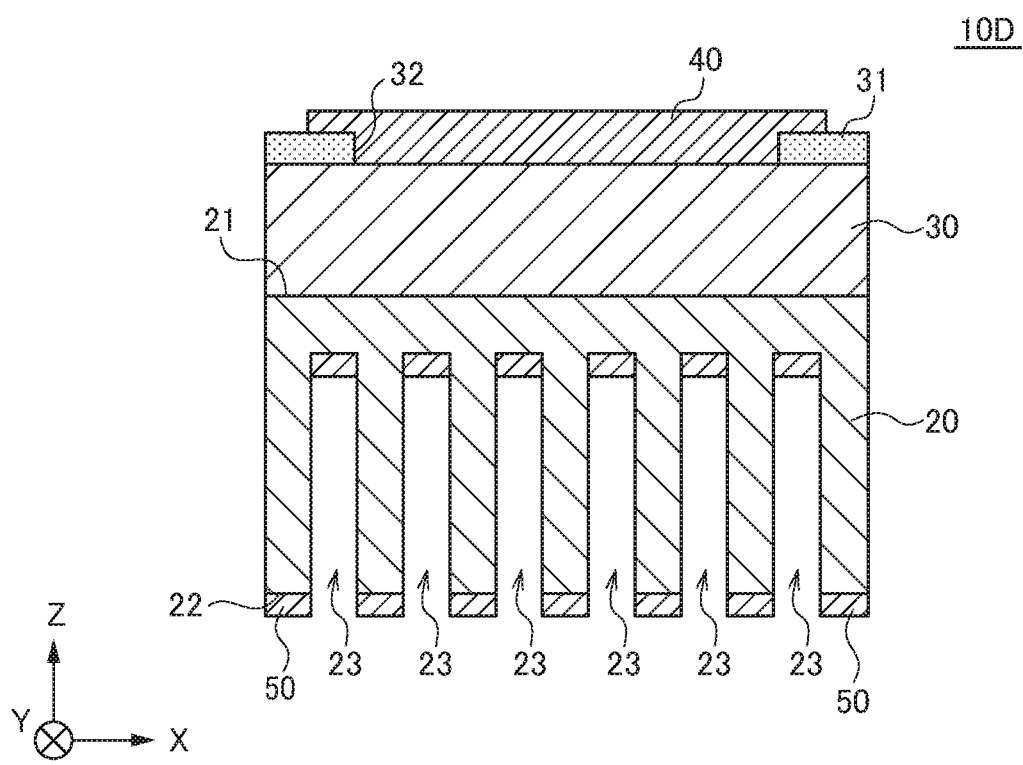
FIG. 6 is a cross-sectional view illustrating the configuration of a Schottky barrier diode 10D according to a fourth embodiment of the present invention.
Figure 7:
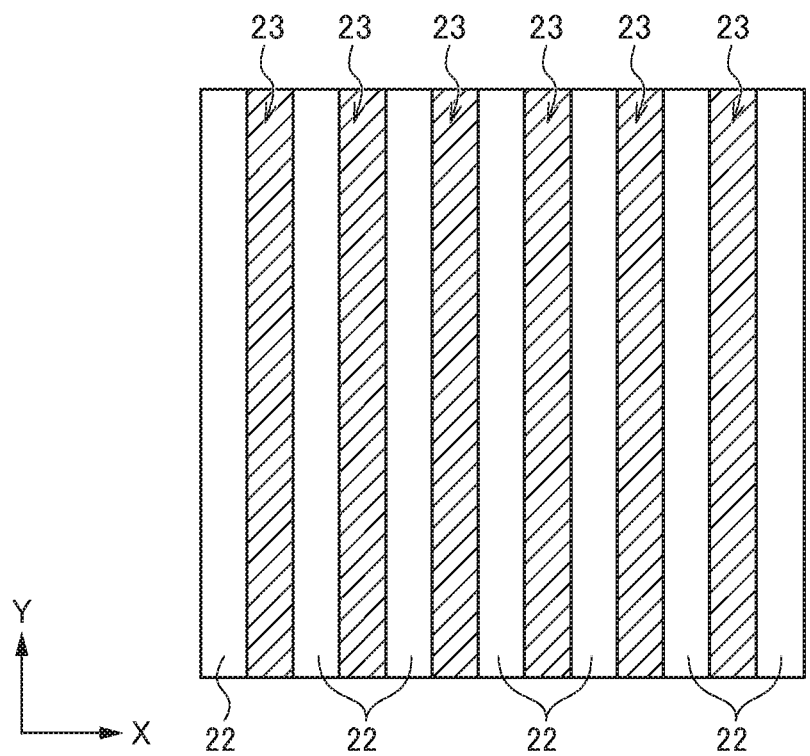
FIG. 7 is a bottom view of the Schottky barrier diode 10D.

FIG. 6 is a cross-sectional view illustrating the configuration of a Schottky barrier diode 10D according to the fourth embodiment of the present invention. FIG. 7 is a bottom view of the semiconductor substrate 20 used in the present embodiment as viewed from the second surface 22 side.

As illustrated in FIGS. 6 and 7, the Schottky barrier diode 10D according to the fourth embodiment of the present invention differs from the Schottky barrier diode 10A according to the first embodiment in that the recessed part 23 is constituted of a plurality of slits. Other configurations are the same as those of the Schottky barrier diode 10A according to the first embodiment, so the same reference numerals are given to the same elements, and overlapping description will be omitted.

In the present embodiment, the recessed part 23 is constituted of six slits extending in the Y-direction. By making the recessed part 23 into such a shape, the mechanical strength of the semiconductor substrate 20 can be enhanced as compared to the first embodiment. Further, like the third embodiment, it is possible to prevent an air layer from being formed in the recessed part 23 at mounting on the circuit board 60 using the solder 63.

Fifth Embodiment

Figure 8:
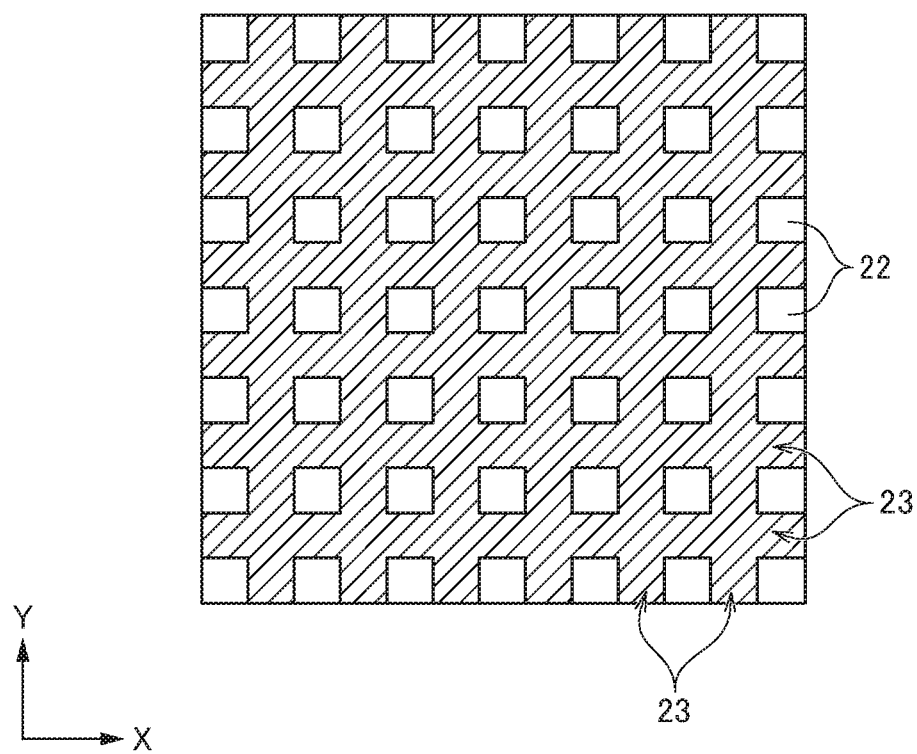
FIG. 8 is a bottom view illustrating the configuration of a Schottky barrier diode 10E according to a fifth embodiment of the present invention.

FIG. 8 is a bottom view illustrating the configuration of a Schottky barrier diode 10E according to the fifth embodiment of the present invention.

As illustrated in FIG. 8, the Schottky barrier diode 10E according to the fifth embodiment of the present invention differs from the Schottky barrier diode 10A according to the first embodiment in that the recessed part 23 is formed in a mesh. Other configurations are the same as those of the Schottky barrier diode 10A according to the first embodiment, so the same reference numerals are given to the same elements, and overlapping description will be omitted.

In the present embodiment, the recessed part 23 is constituted of six slits extending in the X-direction and six slits extending in the Y-direction, which cross each other to form the recessed part 23 into a mesh in a plan view. By forming the recessed part 23 into such a shape, the mechanical strength of the semiconductor substrate 20 can be enhanced as compared to the first embodiment. Further, the air layer is more difficult to form in the recessed part 23 than in the case of the fifth embodiment.

It is apparent that the present invention is not limited to the above embodiments, but may be modified and changed without departing from the scope and spirit of the invention.

Example

A simulation model having the same configuration as the electronic circuit 100 illustrated in FIG. 3 was assumed, and Au was used as the materials of the anode electrode 40 and cathode electrode 50. Using this simulation model, an element temperature was simulated with the depth D and diameter W of the recessed part 23 variously changed. The planar shape of the recessed part 23 was a square. In the simulation model, the dimensions of the semiconductor substrate 20 in the X-, Y-, and Z-directions were 2.4 mm, 2.4 mm, and 250 µm, and the dimensions of the anode electrode 40 in the X-, Y-, and Z-directions were 2.1 mm, 2.1 mm, and 0.3 µm. The solder 63 was fully filled in the entire recessed part 23 and had a thickness of 50 µm from the second surface 22 found outside the recessed part 23. Then, temperature at the center of the anode electrode 40 was simulated with an assumption that forward current was made to flow from the anode electrode 40 to the cathode electrode 50 so as to hold the temperature of a cold plate corresponding to the circuit board 60 at 25° C. and to set consumption power to 2.4 W.

The simulation results are shown in Table 1.

TABLE 1

| D (µm) | 0 | 100 | 200 | 225 | 100 | 150 | 200 | 225 |
|---|---|---|---|---|---|---|---|---|
| W (mm) | 0 | 1 | 1 | 1 | 2 | 2 | 2 | 2 |
| Temperature (° C.) | 54.9 | 48.6 | 40.1 | 39.6 | 48.5 | 43.9 | 39.7 | 39.1 |

As shown in Table 1, the temperature rises up to 54.9° C. when the recessed part 23 is not formed in the semiconductor substrate 20, while the temperature is suppressed to 50° C. or lower when the recessed part 23 is formed in the semiconductor substrate 20. In particular, when the depth D of the recessed part 23 is 200 µm or larger, the temperature is suppressed to about 40° C. or lower, and thus a significantly high heat radiation effect can be obtained.

Further, the larger the depth D of the recessed part 23 is, the lower the element temperature becomes; however, there is no significant difference between when the depth D is 200 µm and when it is 225 µm. When the depth D is 225 µm, the thickness of the semiconductor substrate 20 is reduced to 25 µm, which may cause shortage of mechanical strength. Considering this, depth D=200 µm is advantageous over depth D=225 µm.

The area of the recessed part 23 is about 23% of the area of the anode electrode 40 when the width W of the recessed part 23 is 1 mm, and the area of the recessed part 23 is about 91% of the area of the anode electrode 40 when the width W of the recessed part 23 is 2 mm. Although no significant difference is found between the case when the width W is 1 mm and the case when it is 2 mm, it is recognized that the element temperature becomes lower as the width W of the recessed part 23 is larger.

REFERENCE SIGNS LIST 10A-10E Schottky barrier diode
20 semiconductor substrate
21 first surface
22 second surface
23 recessed part
23a communication hole
24 bottom surface
25 inner wall surface
30 epitaxial layer
31 insulating film
32 opening
40 anode electrode
50 cathode electrode
60 circuit board
61 electrode pattern
62 bonding wire
63 solder
100 electronic circuit

What is claimed is:

1. A Schottky barrier diode comprising:
a semiconductor substrate made of gallium oxide, the semiconductor substrate having a first surface extending in a first direction and a second direction perpendicular to the first direction, a second surface opposite to the first surface, a first side surface extending in the second direction and a third direction perpendicular to the first and second directions, and a recessed part formed on the second surface;
an epitaxial layer made of gallium oxide, the epitaxial layer being provided on the first surface of the semiconductor substrate;
an anode electrode provided at a position overlapping the recessed part as viewed in the third direction and brought into Schottky contact with the epitaxial layer; and
a cathode electrode provided in the recessed part of the semiconductor substrate and brought into ohmic contact with the semiconductor substrate,
wherein the semiconductor substrate further has a first communication hole extending in the first direction and connecting the recessed part to the first side surface, and
wherein the first communication hole is narrower in width in the second direction than the recessed part.

2. The Schottky barrier diode as claimed in claim 1,
wherein the recessed part of the semiconductor substrate includes a bottom surface overlapping the first surface in a plan view and an inner wall surface connecting the bottom surface and the second surface, and
wherein the cathode electrode is formed at least on the bottom surface of the recessed part.

3. The Schottky barrier diode as claimed in claim 2, wherein the cathode electrode is formed further on the inner wall surface of the recessed part.

4. The Schottky barrier diode as claimed in claim 3, wherein the cathode electrode is formed further on an inner wall surface of the first communication hole.

5. The Schottky barrier diode as claimed in claim 2, wherein the cathode electrode is formed further on the second surface positioned outside the recessed part.

6. The Schottky barrier diode as claimed in claim 2, wherein an area of recessed part as viewed in the lamination direction is smaller than an area of the anode electrode.

7. The Schottky barrier diode as claimed in claim 6, wherein the area of the recessed part as viewed in the lamination direction is 50% or more of the area of the anode electrode.

8. The Schottky barrier diode as claimed in claim 1, wherein a thickness of the semiconductor substrate at a position where the recessed part is formed is 50 µm or larger.

9. The Schottky barrier diode as claimed in claim 1,
wherein the semiconductor substrate further has a second side surface extending in the first and third directions, and a second communication hole extending in the second direction and connecting the recessed part to the second side surface, and
wherein the second communication hole is narrower in width in the first direction than the recessed part.

10. The Schottky barrier diode as claimed in claim 9,
wherein the semiconductor substrate further has a third side surface opposite to the first side surface, and a third communication hole extending in the first direction and connecting the recessed part to the third side surface, and
wherein the third communication hole is narrower in width in the second direction than the recessed part.

11. The Schottky barrier diode as claimed in claim 10,
wherein the semiconductor substrate further has a fourth side surface extending in the first and third directions, and a fourth communication hole extending in the second direction and connecting the recessed part to the fourth side surface, and
wherein the fourth communication hole is narrower in width in the first direction than the recessed part.

12. The Schottky barrier diode as claimed in claim 11, wherein the recessed part is a circular shape as viewed in the third direction.

13. An electronic circuit comprising:
a circuit board having an electrode pattern;
the Schottky barrier diode as claimed in claim 1, mounted on the circuit board; and
a conductive member at least partially embedded in the recessed part of the semiconductor substrate and connecting the electrode pattern and the cathode electrode.

* * * * *